US006789222B2

(12) United States Patent
Buckley, Jr.

(10) Patent No.: US 6,789,222 B2
(45) Date of Patent: Sep. 7, 2004

(54) SINGLE-PASS METHODS FOR GENERATING TEST PATTERNS FOR COMBINATIONAL CIRCUITS

(75) Inventor: Delmas Robert Buckley, Jr., Palo Alto, CA (US)

(73) Assignee: Yardstick Research, L.L.C., Livermore, CA (US)

( * ) Notice: Subject to any disclaimer, the term of this patent is extended or adjusted under 35 U.S.C. 154(b) by 599 days.

(21) Appl. No.: 09/754,936

(22) Filed: Jan. 5, 2001

(65) Prior Publication Data

US 2002/0091980 A1 Jul. 11, 2002

(51) Int. Cl.[7] ............................. G01R 31/28; H01L 25/00

(52) U.S. Cl. .......................................... 714/738; 326/41

(58) Field of Search ................................. 714/724, 741, 714/738; 326/41

(56) References Cited

U.S. PATENT DOCUMENTS

| 4,204,633 | A |   | 5/1980  | Goel .......................... 714/738     |
|-----------|---|---|---------|--------------------------------------------|
| 4,779,273 | A | * | 10/1988 | Beucler et al. ............. 714/732        |
| 5,390,193 | A | * | 2/1995  | Millman et al. ............. 714/741        |
| 5,657,240 | A | * | 8/1997  | Chakradhar et al. ........... 716/4         |
| 5,726,996 | A | * | 3/1998  | Chakradhar et al. ........ 714/724          |
| 5,831,996 | A | * | 11/1998 | Abramovici et al. ........ 714/738          |
| 5,862,149 | A | * | 1/1999  | Carpenter et al. .......... 714/726         |
| 5,896,401 | A | * | 4/1999  | Abramovici et al. ........ 714/741          |
| 6,215,327 | B1 | * | 4/2001 | Lyke ........................... 326/41     |
| 6,442,722 | B1 | * | 8/2002 | Nadeau-Dostie et al. ... 714/731           |
| 6,463,560 | B1 | * | 10/2002 | Bhawmik et al. ........... 714/733         |
| 6,467,058 | B1 | * | 10/2002 | Chakradhar et al. ........ 714/745         |
| 6,477,684 | B1 | * | 11/2002 | Sanghani ....................... 716/4     |
| 6,611,933 | B1 | * | 8/2003 | Koenemann et al. ....... 714/726           |

OTHER PUBLICATIONS

Theory and application of GF(2p) cellular automata as on–chip test pattern generator Sikdar et al. VLSI Design, 2000. Thirteent International Conference on , Jan. 3–7, 2000 pp.: 556–561.*
TDB:ACC–NO: NN910470 Disclosure Title: Deterministic Test Generation for Transition Faults. Publication–Data: IBM Technical Disclosure Bulletin, Apr. 1991, US vol. No.: 33 Issue No.: 11 Page No.: 70–71.*
Disclosure Title: Single–Pass Three–State Driver Testing□□Publication–Data: IBM Technical Disclosure Bulletin, May 1983, US vol. No.: 25 Issue No.: 12 Page No.: 6617–6620 Publication–Date: May 1, 1983.*
TDB–ACC–No: NN83056586 Disclosure Title: Simulation Algorithm Publication–Data: IBM Technical Disclosure Bulletin, May 1983, US vol. No.: 25 Issue No.: 12 Page No.: 6586–6587 Publication–Date: Ma 1, 1983□□.*

(List continued on next page.)

*Primary Examiner*—Emmanuel L. Moise
*Assistant Examiner*—Cynthia Butt
(74) *Attorney, Agent, or Firm*—Robert Buckley (57) ABSTRACT

A method that finds all test vectors for all detectable single stuck-at faults in a combinational circuit during a single pass through the circuit sorts a netlist into circuit-level order, provides a library of fault-propagation and path-enabling rules for the circuit's logic elements, begins at the level of the primary inputs, and applies the rules, one logic element at a time, circuit-level-by-circuit-level until the entire circuit has been processed. The resulting fault-propagation functions for each output line define every combination of primary input signals that makes a fault detectable at that output line. In another embodiment, the method determines the highest circuit level at which each signal is used, and releases storage being used for previously computed fault-propagation functions and path-enabling functions for any signal having no further uses. The elimination of no longer needed stored information permits the method to handle larger circuits given finite resources.

18 Claims, 10 Drawing Sheets

OTHER PUBLICATIONS

Roth, J.P., et al., "Programmed Algorithms to Compute Tests to Detect and Distinguish Between Failures in Logic Circuits" IEEE Trans. on Elec. Comp., vol. EC–16, No. 5, Oct. 1967, pp. 567–580.

Underwood B., et al., "The Parallel–Test–Detect Fault Simulation Algorithm," 1989 Int'l Test Confr., 1989 IEEE.

Goel, P., "An Implicit Enumeration Algorithm to Generate Tests for Combinatorial Logic Circuits," IEEE Trans. on Comp., vol. C–30, No. 3, Mar. 1981, pp. 215–222.

Abramovici, M., et al., "Digital Systems Testing and Testable Design," Computer Science Press, N.Y. 1990, pp. 94–95.

* cited by examiner

SOUT = S1 · S2 · I1' · I2' + ....

= 11000000 · 00000000 · 00101111 · 01010101 + ....

602

SOUT = ... + S1 · S2' · I2 + ....

ONE-INPUT DEVICES:

(901) A PRIMARY INPUT SIGNAL:
SOUT = Φ, WHERE Φ IS THE EMPTY SET
IOUT = I1

(902) AN INVERTER:
SOUT = S1
IOUT = I1'

FIG. - 9

(903) A FOLLOWER:
SOUT = S1
IOUT = I1

TWO-INPUT DEVICES:

(1001) A 2-INPUT AND GATE:
SOUT = S1.S2.I1'.I2' + S1.S2'.I2 + S1'.S2.I1 + (S1 + S2).I1.I2

IOUT = I1.I2

(1002) A 2-INPUT OR GATE:
SOUT = S1.S2.I1.I2 + S1.S2'.I2' + S1'.S2.I1' + (S1 + S2).I1'.I2'

IOUT = I1 + I2

(1003) A 2-INPUT NAND GATE:
SOUT = S1.S2.I1'.I2' + S1.S2'.I2 + S1'.S2.I1 + (S1 + S2).I1.I2

FIG. - 10

IOUT = I1' + I2'

(1004) A 2-INPUT NOR GATE:
SOUT = S1.S2.I1.I2 + S1.S2'.I2' + S1'.S2.I1' + (S1 + S2).I1'.I2'

IOUT = I1'.I2'

(1005) A 2-INPUT XOR GATE:
SOUT = S1.S2' + S1'.S2

IOUT = I1'.I2 + I1.I2'

THREE-INPUT DEVICES:

(1101) A 3-INPUT AND GATE:
SOUT = S1.S2.S3.I1'.I2'.I3' + S1.S2.S3'.I1'.I2'.I3
+ S1.S2'.S3.I1'.I2.I3' + S1.S2'.S3'.I2.I3
+ S1'.S2.S3.I1.I2'.I3' + S1'.S2.S3'.I1.I3
+ S1'.S2'.S3.I1.I2 + (S1 + S2 + S3).I1.I2.I3

IOUT = I1.I2.I3

(1102) A 3-INPUT OR GATE:
SOUT = S1.S2.S3.I1.I2.I3 + S1.S2.S3'.I1.I2.I3'
+ S1.S2'.S3.I1.I2'.I3 + S1.S2'.S3'.I2'.I3'
+ S1'.S2.S3.I1'.I2.I3 + S1'.S2.S3'.I1'.I3'
+ S1'.S2'.S3.I1'.I2' + (S1 + S2 + S3).I1'.I2'.I3'

IOUT = I1 + I2 + I3

FIG. - 11

(1103) A 3-INPUT NAND GATE:
SOUT = S1.S2.S3.I1'.I2'.I3' + S1.S2.S3'.I1'.I2'.I3
+ S1.S2'.S3.I1'.I2.I3' + S1.S2'.S3'.I2.I3
+ S1'.S2.S3.I1.I2'.I3' + S1'.S2.S3'.I1.I3
+ S1'.S2'.S3.I1.I2 + (S1 + S2 + S3).I1.I2.I3

IOUT = I1' + I2' + I3'

(1104) A 3-INPUT NOR GATE:
SOUT = S1.S2.S3.I1.I2.I3 + S1.S2.S3'.I1.I2.I3'
+ S1.S2'.S3.I1.I2'.I3 + S1.S2'.S3'.I2'.I3'
+ S1'.S2.S3.I1'.I2.I3 + S1'.S2.S3'.I1'.I3'
+ S1'.S2'.S3.I1'.I2' + (S1 + S2 + S3).I1'.I2'.I3'

IOUT = I1'.I2'.I3'

SOUT-AF = (A/0: 11110000; A/1: 00001111)
IOUT-A = 11110000
SOUT-BF = (B/0: 11001100; B/1: 00110011)
IOUT-B = 11001100
SOUT-CF = (C/0: 10101010; C/1: 01010101)
IOUT-C = 10101010

FIG. - 12

SOUT-D = SOUT-AF . SOUT-BF . IOUT-A' . IOUT-B'
       + SOUT-AF . SOUT-BF' . IOUT-B
       + SOUT-AF' . SOUT-BF . IOUT-A
       + (SOUT-AF + SOUT-BF) . IOUT-A . IOUT-B

IOUT-D = IOUT-A . IOUT-B

FIG. - 13

SOUT-D = (A/0: 11110000; A/1: 00001111) . (B/0: 11001100; B/1: 00110011)
         . 00001111 . 00110011
       + (A/0: 11110000; A/1: 00001111) . (B/0: 00110011; B/1: 11001100)
         . 11001100
       + (A/0: 00001111; A/1: 11110000) . (B/0: 11001100; B/1: 00110011)
         . 11110000
       + [(A/0: 11110000; A/1: 00001111) + (B/0: 11001100; B/1: 00110011)]
         . 11110000 . 11001100

IOUT-D = 11110000 . 11001100

FIG. - 14

SOUT-D = (A/0: 11110000 . 00000000 . 00001111 . 00110011
+ 11110000 . 11111111 . 11001100
+ 00001111 . 00000000 . 11110000
+ (11110000 + 00000000) . 11110000 . 11001100;
A/1: 00001111 . 00000000 . 00001111 . 00110011
+ 00001111 . 11111111 . 11001100
+ 11110000 . 00000000 . 11110000
+ (00001111 + 00000000) . 11110000 . 11001100;
B/0: 00000000 . 11001100 . 00001111 . 00110011
+ 00000000 . 00110011 . 11001100
+ 11111111 . 11001100 . 11110000
+ (00000000 + 11001100) . 11110000 . 11001100;
B/1: 00000000 . 00110011 . 00001111 . 00110011
+ 00000000 . 11001100 . 11001100
+ 11111111 . 00110011 . 11110000
+ (00000000 + 00110011) . 11110000 . 11001100)
IOUT-D = 11110000 . 11001100

FIG. - 15

SOUT-D = (A/0: 11000000; A/1: 00001100; B/0: 11000000; B/1: 00110000)
IOUT-D = 11000000

FIG. - 16

SOUT-DF = (A/0: 11000000; A/1: 00001100; B/0: 11000000; B/1: 00110000;
D/0: 11000000; D/1: 00111111)
IOUT-D   = 11000000

FIG. - 17

SOUT-E = SOUT-DF . SOUT-CF . IOUT-D . IOUT-C
     + SOUT-DF . SOUT-CF' . IOUT-C'
     + SOUT-DF' . SOUT-CF . IOUT-D'
     + (SOUT-DF + SOUT-CF) . IOUT-D' . IOUT-C'
IOUT-E = IOUT-D' . IOUT-C'

FIG. - 18

SOUT-E = (A/0: 11000000 . 00000000 . 11000000 . 10101010
     + 11000000 . 11111111 . 01010101
     + 00111111 . 00000000 . 00111111
     + (11000000 + 00000000) . 00111111 . 01010101;
   A/1: 00001100 . 00000000 . 11000000 . 10101010
     + 00001100 . 11111111 . 01010101
     + 11110011 . 00000000 . 00111111
     + (00001100 + 00000000) . 00111111 . 01010101;
   B/0: 11000000 . 00000000 . 11000000 . 10101010
     + 11000000 . 11111111 . 01010101
     + 00111111 . 00000000 . 00111111
     + (11000000 + 00000000) . 00111111 . 01010101;
   B/1: 00110000 . 00000000 . 11000000 . 10101010
     + 00110000 . 11111111 . 01010101
     + 11001111 . 00000000 . 00111111
     + (00110000 + 00000000) . 00111111 . 01010101;
   C/0: 00000000 . 10101010 . 11000000 . 10101010
     + 00000000 . 01010101 . 01010101
     + 11111111 . 10101010 . 00111111
     + (00000000 + 10101010) . 00111111 . 01010101;
   C/1: 00000000 . 01010101 . 11000000 . 10101010
     + 00000000 . 10101010 . 01010101
     + 11111111 . 01010101 . 00111111
     + (00000000 + 01010101) . 00111111 . 01010101;
   D/0: 11000000;
   D/1: 00111111)
IOUT-E = 00111111 . 01010101

FIG. - 19

SOUT-E = (A/0: 01000000; A/1: 00000100; B/0: 01000000; B/1: 00010000;
C/0: 00101010; C/1: 00010101; D/0: 11000000; D/1: 00111111)
IOUT-E = 00010101

FIG. - 20

SOUT-EF = (A/0: 01000000; A/1: 00000100; B/0: 01000000; B/1: 00010000;
C/0: 00101010; C/1: 00010101; D/0: 11000000; D/1: 00111111;
E/0: 00010101; E/1: 11101010)
IOUT-E = 00010101

FIG. - 21

SINGLE-PASS METHODS FOR GENERATING TEST PATTERNS FOR COMBINATIONAL CIRCUITS

FIELD OF THE INVENTION

The invention relates generally to electrical computers and digital processing systems, and more particularly to test pattern generators.

BACKGROUND OF THE INVENTION

Known automatic test pattern generation ("ATPG") methods activate a fault at a site, attempt to propagate the fault to an output, then work backward through the circuit in an effort to "justify" signal levels needed to activate and propagate the fault (see for example Roth, J. P., "Diagnosis of automata failures: A calculus and a method," IBM J. Res.Dev. 10:278–281, 1966).

The U.S. Pat. No. 4,204,633 to Goel, issued May 27, 1980, teaches a method that avoids the need for backward justification. However, when signal assignment conflicts arise, previous decisions are systematically reversed until an input combination is found that makes the fault detectable at an output. When a fault has no test or few tests, considerable time may be consumed in a sometimes-fruitless search for a conflict-free input assignment.

SUMMARY OF THE INVENTION

A preferred embodiment of the present invention defines a method for generating all tests for all detectable faults during a single pass through a sorted definition of a combinational circuit. Such a method avoids the conditional behavior of many currently used methods.

The method provides a netlist defining a combinational circuit in terms of interconnected primary inputs, logic elements, and primary outputs. The netlist is sorted into an ascending circuit-level order commencing at the level of the primary inputs. Data structures are defined for a fault, a fault-propagation function, and a path-enabling function. A library of Boolean function combining rules is provided for each of the logic element types present in the circuit definition. Initial data structures are created for each of the primary inputs.

The rules are applied to the data structures that form the inputs to each circuit level to create and store data structures that will form the inputs to the next circuit level, commencing at the level of the primary inputs, and progressing through the circuit definition circuit-level-by-circuit-level.

In the preferred embodiment an attempt is made to activate and propagate all faults to primary outputs during a single pass through the circuit definition. Each fault reaching a primary output is a detectable fault. The fault-propagation function for each detectable fault defines all primary input assignments that permit the fault to be activated and propagated to the primary output. These input assignments define all tests for the detectable fault.

The computational effort of creating the path-enabling functions is shared among all faults during the single pass, thus reducing the overall effort. The preferred path-enabling function is the 1-set.

In another embodiment, the invention defines methods that release no-longer-needed data structure storage, permitting the handling of larger circuits. In yet another embodiment, the invention defines methods that stop propagating faults once they reach a primary output, thereby reducing overall computational effort.

DESCRIPTION OF THE PREFERRED EMBODIMENTS

Some Definitions

Definitions are provided here for "fault-propagation" functions, "1-sets", and "faults" as those terms are used in the present invention. These definitions are based on a single stuck-at fault model (see Abramovici et al., "Digital Systems Testing and Testable Design", Computer Science Press, New York, 1990, pg. 94). Additional definitions and a detailed, specific example of one embodiment of the present invention are provided later in this description.

A fault-propagation function is a Boolean expression defining all primary input assignments that propagate a fault to a given point in a circuit. A fault is said to be "propagated" to a given point in a circuit when a fault-free copy of the circuit creates a logic level at the point different from the logic level created by a faulty copy of the circuit when any of the defined primary input assignments is applied to the circuit primary inputs.

Figure 10:
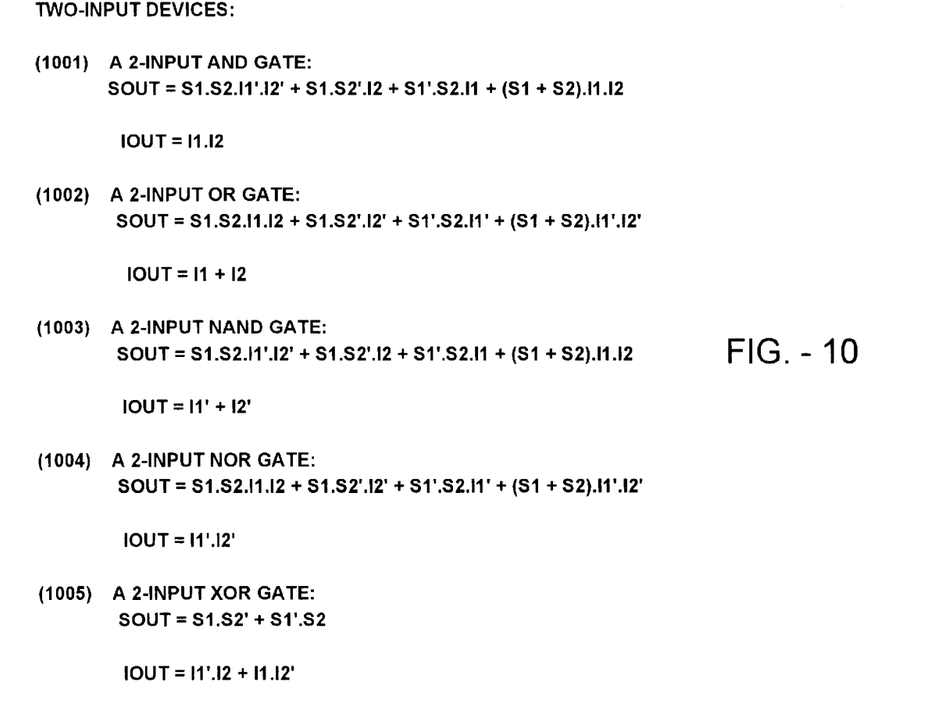
FIG. 10 is a list of equations defining fault-propagation and path-enabling rules for typical two-input logic devices.

A "fault-propagation" function SOUT for a two-input AND gate is defined by equations 1001 of FIG. 10, where S1 and I1 are the "fault-propagation" and the "path-enabling" (1-set) Boolean functions, respectively, for one input to the two-input AND gate, and S2 and I2 are the corresponding functions for the second input. Boolean intersection is designated by the "period" punctuation symbol, Boolean union by the "plus" arithmetic symbol and Boolean negation by the trailing "single quote" punctuation symbol. SOUT is the fault-propagation function, while the expression on the right-hand side of the equals sign is a rule for combining Boolean functions. The specific rule illustrated by first equation 1001 is for the two-input AND gate. Other rules are illustrated later in this description and the accompanying drawing figures.

A path-enabling function is another Boolean expression that defines all primary input assignments that make a point in the circuit be a logical 1 (a 1-set), or alternately, a 0 (a 0-set). The preferred embodiment for a path-enabling function in the present invention is the 1-set.

A "1-set" function IOUT for the two-input AND gate is defined by second equation 1001 in FIG. 10.

A "fault" is an object having two parts: a fault name, and a fault-propagation function. An example of a fault is A/0: 01000000, where A/0 is a fault name for the signal A stuck-at-0, and the vector 01000000 is a fault-propagation function defining primary input assignments propagating the fault to a specific point in a combinational circuit.

A person having an ordinary level of skill in the relevant arts will appreciate that a fault, a fault-propagation function, and a path-enabling function can be implemented using many different representations, models, data structures. The specific data structures used in this description are exemplary only unless otherwise stated.

The word "fault" is used in several contexts within this description. In the paragraph that follows this one, the word is used informally and refers to a fault name. Later uses of the word are in the more formal sense defined above in which a fault is an object having two parts. It is the two-part object that is activated and propagated by the methods described below.

Figure 1:
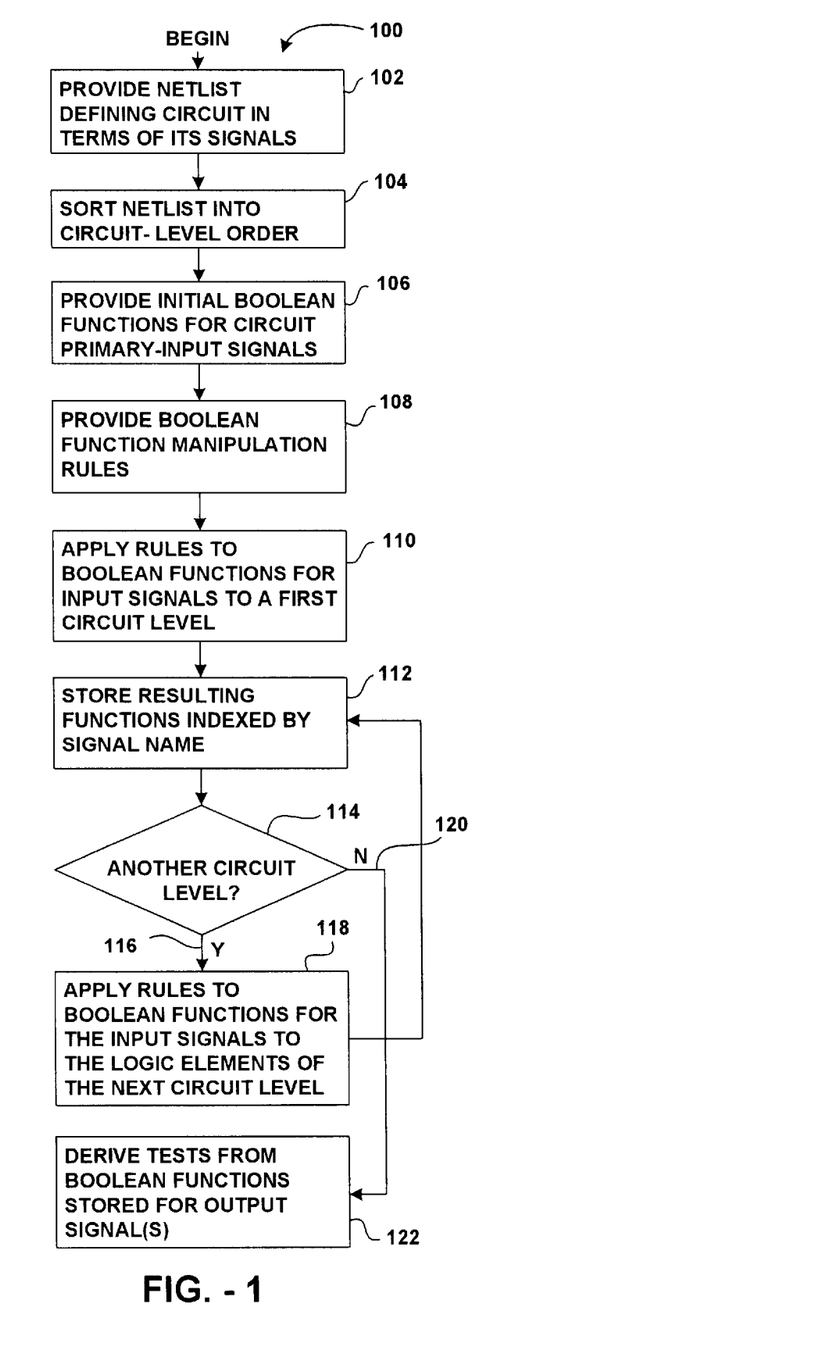
FIG. 1 is a process flow diagram that illustrates a single-pass ATPG method for finding all tests for all detectable faults in a combinational circuit.

FIG. 1

FIG. 1 is a process flow diagram that illustrates a single-pass ATPG method for finding all tests for all detectable faults in a combinational circuit. The method is designated generally by the reference numeral 100 and includes process steps 102 through 122. The method begins with a step 102 for providing a netlist that defines a combinational circuit in terms of its signals, e.g., a list of logic equations defining the gates/logic elements of a combinational circuit. Other types of netlist are obtained by techniques such as schematic capture and pre-verification synthesis.

The method continues with a step 104 for sorting the netlist in an ascending circuit-level order from the level of the primary input signals through the output signal levels, so that each signal of the sorted circuit is used, if at all, only at a circuit level higher than the level at which it is received/generated.

The method continues with a step 106 for providing initial Boolean functions for the circuit primary input signals. The initial Boolean functions include a pair of faults for each primary input-a stuck-at-0 fault, and a stuck-at-1 fault-and a path-enabling function (1-set).

The method continues at step 108 with providing Boolean function manipulation rules, a sample of which is provided by first and second equations 1001 of FIG. 10 for a two-input AND gate. Typically, a library of such rules is provided for each gate/logic element type used in the circuit. Examples of such gate/logic elements include Inverters, Followers, AND gates, OR gates, Exclusive-OR gates, Buffers, and the like.

The method continues at step 110 with applying the Boolean function manipulation rules defined in step 108 to the Boolean functions for the primary input signals. This process of applying a Boolean function manipulation rule to each signal of a circuit level produces a 1-set and a pair of faults for each signal, and propagates some faults that arrive at a gate's inputs.

The resulting functions are stored, indexed by signal name, at method step 112, and a determination is made at step 114 whether or not there are additional circuit levels.

If additional circuit levels exist ("Y" 116), the method continues at step 118 with applying the Boolean function manipulation rules to the signals/gates/logic elements of the next circuit level of the sorted circuit. Once again, the gate/logic element type is used to select which Boolean function manipulation rule is applied, e.g., AND gate, OR gate, Inverter, and the like. The selected rule is applied to the Boolean function pair (1-set, fault-propagation function) created and stored during a previous level.

The method continues in this manner until no further circuit levels remain ("N" 120). At step 122 the fault-propagation function for any faults arriving at an output line defines all primary input signal assignments that make a fault detectable at the output line.

In this manner, all tests for all detectable faults are discovered in one pass through the sorted circuit.

Figure 2:
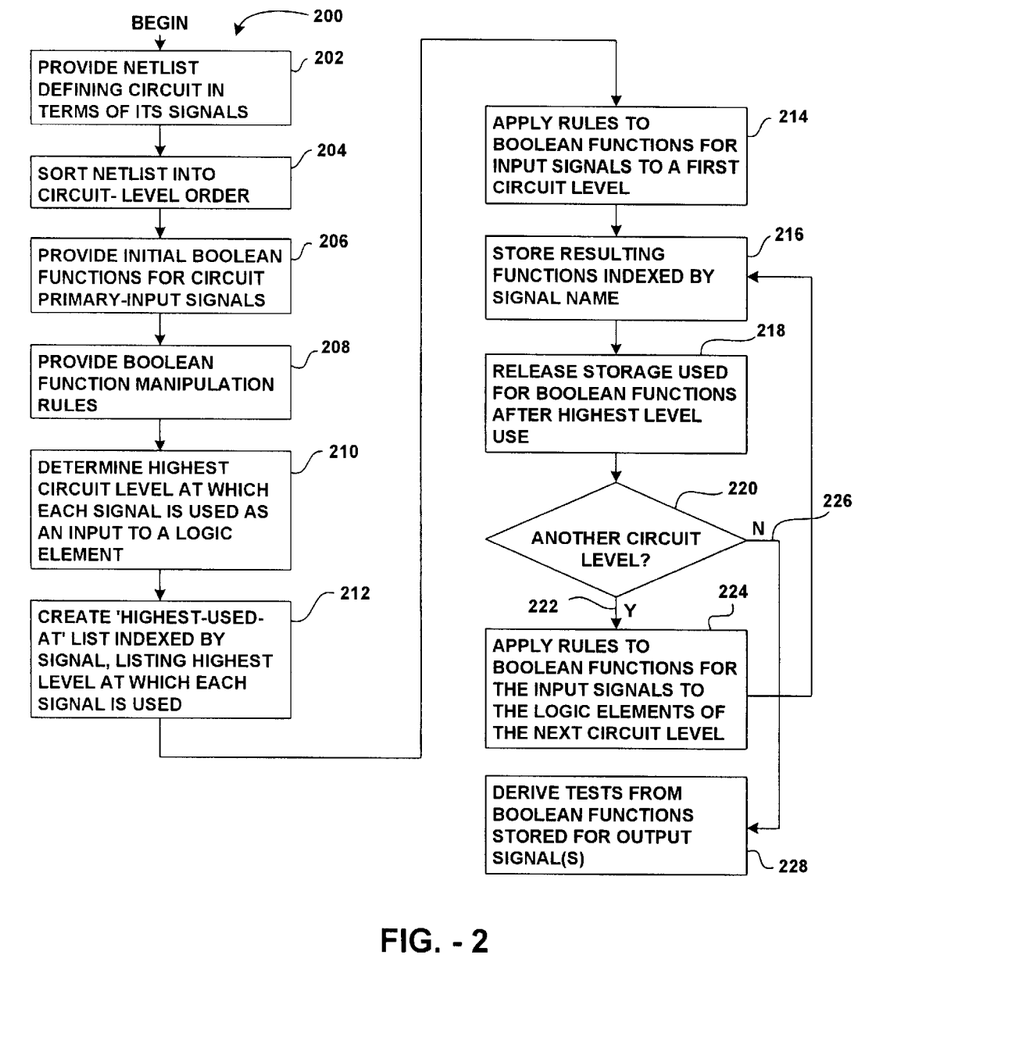
FIG. 2 is a process flow diagram that illustrates a single-pass ATPG method in which no-longer-needed stored results are released, permitting larger circuits to be handled.

FIG. 2

In another embodiment of the single-pass ATPG method, no-longer-needed Boolean functions are discarded, thereby freeing valuable storage for new functions and permitting the handling of larger circuits. The embodiment requires creation of a signal "used-at" list that lists the highest circuit level at which each signal is used. The list is consulted at predetermined intervals and commands are issued to release storage being used for no-longer-needed signal functions.

This alternative embodiment is illustrated in FIG. 2, a method flow diagram in which the method is designated generally by the reference numeral 200. The alternative embodiment method includes steps 202 through 228. It will be noted that steps 202 through 208 correspond directly with steps 102 through 108 of the method of FIG. 1.

It will also be noted that steps 214, 216, 220 through 228 of the alternative method of FIG. 2 correspond with steps 114 through 124 of FIG. 1. The difference between the two methods is that in the alternative method of FIG. 2, at steps 210, 212 and 218, a determination is made of the highest circuit level at which each signal is used, and the storage required for the Boolean function pair (1-set, fault-propagation function) for that signal is released after the highest level use has occurred. In this way, storage is made available for new functions as soon as the storage is no longer needed for earlier functions. This storage management policy permits the handling of a larger circuit for a given amount of available storage. It is contemplated that both internal storage, e.g., RAM, and external storage, e.g., hard disk, will be managed according to such a policy.

This approach enjoys the advantage of permitting the storage required to temporarily hold the 1-sets to be released when it is no-longer-needed, just as the storage for the fault-propagation functions is released when it is no-longer-needed. The advantage of storage release is that larger circuits (and circuit partitions) can he handled for a given-size memory.

Once the sorted netlist, initial primary input Boolean functions, and a library of Boolean function manipulating rules is in place, the method proceeds generally in the following manner. Starting at the primary input level and progressing level-by-level through the sorted circuit until there are no further gates to process, each gate is processed in turn. A gate is processed by connecting the 1-sets and fault-propagation functions for its input signals to a rule corresponding to the type of the gate, and applying the rule to produce an output 1-set and fault-propagation function, both of which are stored. If release of no-longer-needed storage is implemented, the storage for the 1-set and the fault-propagation functions is released after the highest-level use of the signal.

In this incremental manner, the process works its way through the sorted circuit, releasing no-longer-needed storage behind it as it moves forward through the circuit. There is thus always a zone of activity including the gates at a leading-edge circuit level and those gates below that level whose stored functions have not yet been used at their highest-level use. You can think of it as a wave of activity moving through the circuit from the lowest circuit level (the primary input level) to the highest circuit level, the most rearward boundary of the zone existing in a somewhat ragged fashion at a point where no-longer-needed storage is being released. When the process is completed, the fault-propagation functions for the signals connected to the primary output lines define all detectable tests for a fault detectable at the specific output line.

In the present invention all detectable tests for all faults are discovered during a single pass through the sorted circuit while sharing between all the faults the computational effort of creating the 1-sets.

The methods described in this invention employ a single stuck-at fault model. However, the methods are readily adapted for use with other fault models, for example the gate-delay and the path-delay fault models. It is believed that these methods can also be adapted without too much work for use with open/shorted and bridging-fault models.

These methods have been described with respect to Boolean manipulations of the fault-propagation function and 1-sets. The methods work equally well when the Boolean functions implement a Boolean difference (see Fujiwara, H., "Logic Testing and Design for Testability," The MIT Press, 1986, at pages 24–30).

Experimental results have shown that the fault-propagation embodiments operate faster than the Boolean difference embodiments. However, when higher level logic elements are defined, e.g., a full adder or a multiplier, the equations that must be written are more difficult and prone to human error when the fault-propagation model is used. The Boolean difference equations for higher level logic elements are more intuitive and therefore easier to create without error.

The order for processing logic elements at the same circuit level is immaterial—they can be processed in any sequence so long as all logic elements at a given level are processed before the logic elements at a higher level. As a consequence, the method lends itself to implementation using separate, parallel processors, each handing different logic elements at the same circuit level.

Additional Definitions

Figure 9:
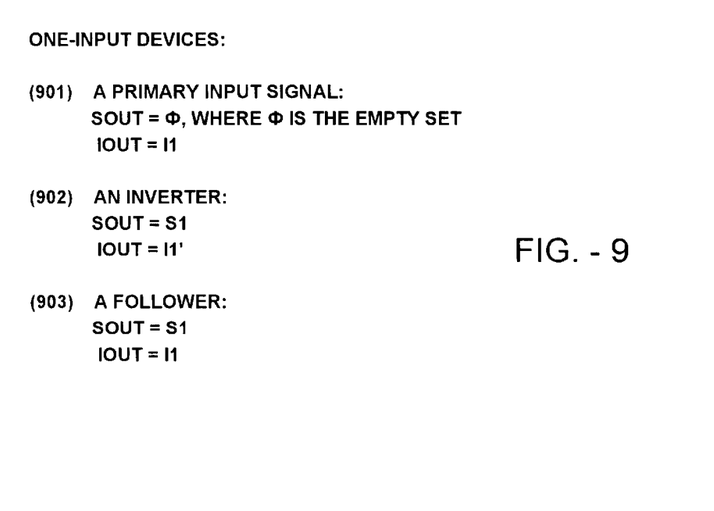
FIG. 9 is a list of equations defining fault-propagation and path-enabling rules for typical single-input logic devices.
Figure 11:
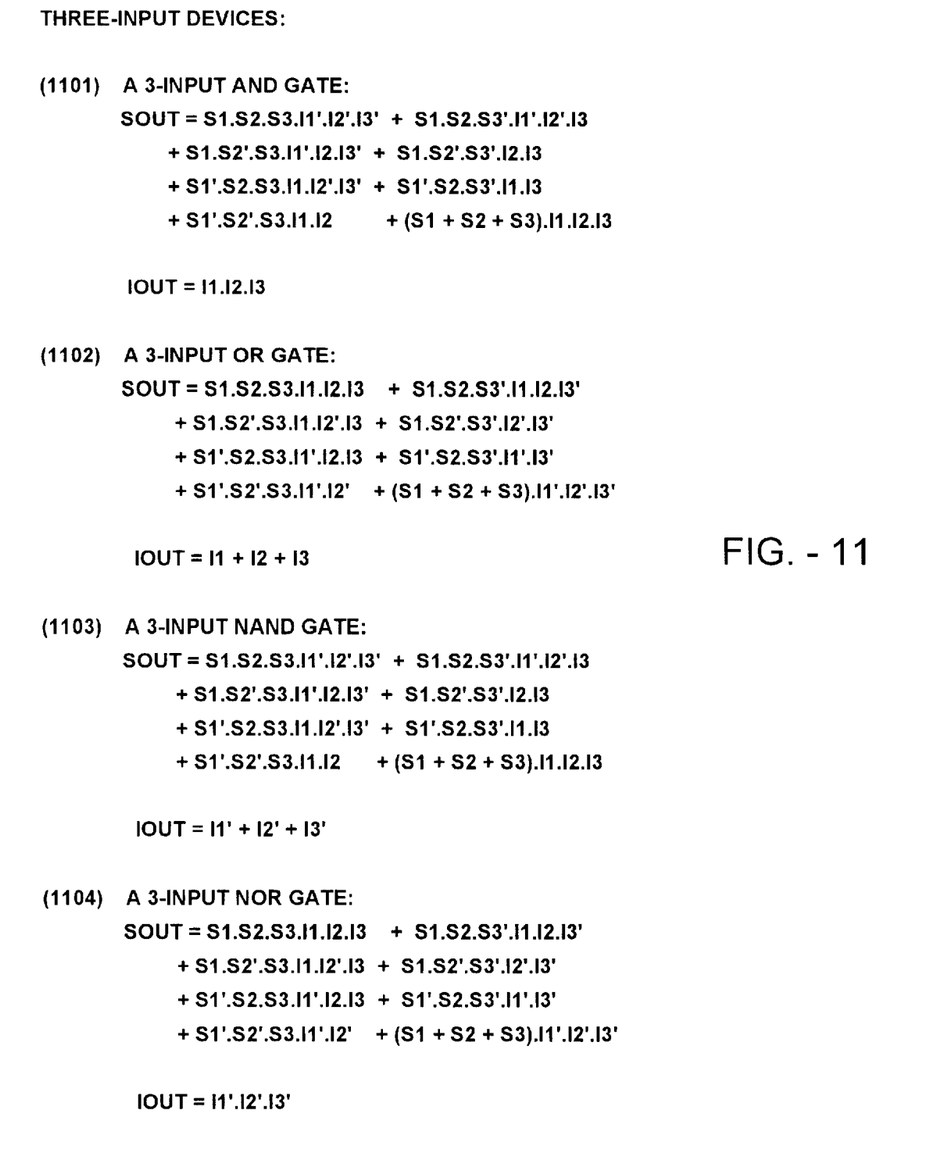
FIG. 11 is a list of equations defining fault-propagation and path-enabling rules for typical three-input logic devices.

Definitions of fault-propagation and path-enabling rules for typical one-input, two-input, and three-input logic devices are shown in FIGS. 9–11, respectively.

FIGS. 3, 4, 5, 6: An Example

Figure 3:
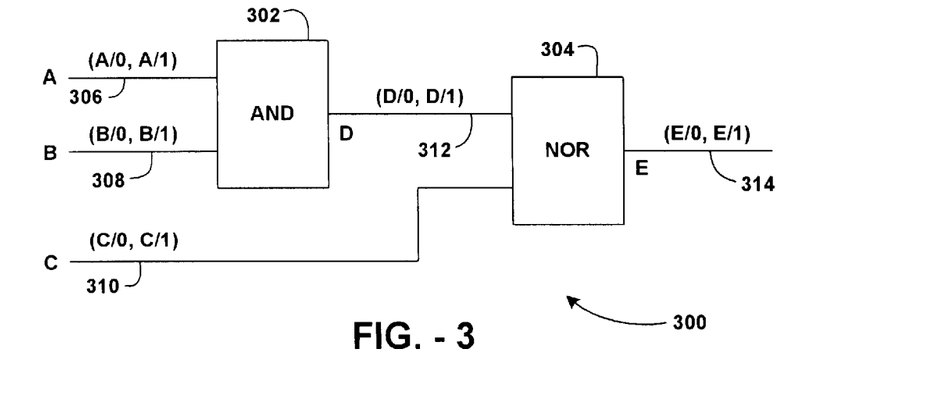
FIG. 3 is a logic diagram illustrating a simple combinational circuit.

FIG. 3 is a logic diagram illustrating a simple combinational circuit designated generally by the reference numeral 300. The logic circuit 300 includes 2-input AND gate 302, 2-input NOR gate 304, primary input lines A 306, B 308, and C 310, AND gate output line D 312, and NOR gate output line E 314. The output line E 314 is also a primary output line.

The primary input line A 306 can be fault-free, stuck-at-0 "A/0", or stuck-at-1"A/1". In like manner each line of the circuit 300 can be fault-free, stuck-at-0, or stuck-at-1. The methods of this invention rely on a single stuck-at fault model. In a single stuck-at fault model a circuit is assumed to be either fault free, or to contain at most a single line stuck-at 0 or 1.

Goel (U.S. Pat. No. 4,204,633) teaches that all internal lines and outputs of a combinational circuit can be expressed in terms of combinations of the primary input signals without loss of generality. The present invention relies upon that teaching.

Figure 4:
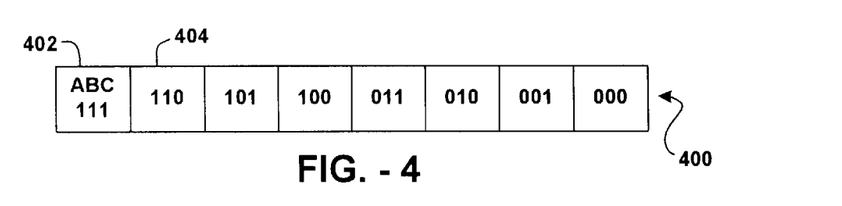
FIG. 4 is a diagram illustrating an 8-bit vector.

Applying Goel's teaching, the fault-propagation function and the 1-set function for each line of the circuit 300 are expressed as functions of the three primary input lines A 306, B 308, and C 310. FIG. 4 is a diagram illustrating an 8-bit vector 400. Each bit of the vector 400 corresponds to a different combination of the three primary input lines A, B, C. Thus the left-most bit 402 of the vector 400 corresponds to A=1, B=1, C=1, while the adjacent bit 404 corresponds to A=1, B=1, C=0 and so on.

Figure 5:
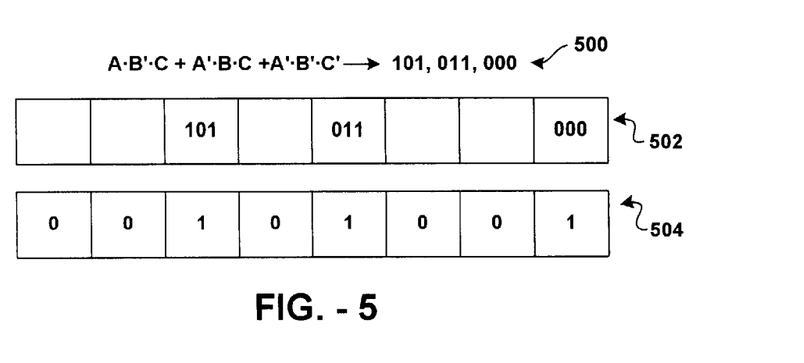
FIG. 5 is a diagram illustrating a specific function of three input lines A, B, C; an 8-bit vector; and another 8-bit vector representing the specific function.

FIG. 5 is a diagram illustrating a specific function 500 of the three input lines A, B, C, an 8-bit vector 502, and an 8-bit vector 504 representing the function 500. FIGS. 4 and 5 are intended to introduce a data structure that will be used throughout the remainder of this example. The Boolean function 500 is A.B'.C+A'.B.C+A'.B'.C', where the period symbol implies logical intersection, the plus symbol implies logical union, and the single quote implies logical negation of the preceding symbol. The function 500 corresponds to input signal levels 101, 011, and 000, respectively. Thus in vector 502 the bit positions corresponding to those combinations are marked, while the remaining bit positions remain empty. The 8-bit vector 504 has a 1 at each of the bit positions corresponding to 101, 011, 000, and 0's in all other positions. The 8-bit vector 504 is used to represent the Boolean function 500. In the remainder of the following example, every Boolean function will be represented by an 8-bit vector in which the 1's will correspond to each combination of the three primary inputs A, B, C that make up the function.

In general, such a representation is not practical because its size doubles with each additional input line. But the circuit 300 has three input lines only, so the 8-bit vector representation is used in this example because of the ease with which it can be manipulated and inverted.

The library of Boolean function combining rules includes a primary input signal as illustrated by rules 901 of FIG. 9, a two-input AND gate as illustrated by rules 1001 of FIG. 10, and a two-input NOR gate as illustrated by rules 1004 of FIG. 10.

The circuit 300 is processed in an ascending circuit-level order, starting at the level of the primary input lines, progressing to the AND gate 302, and finally to the NOR gate 304.

Figure 12:
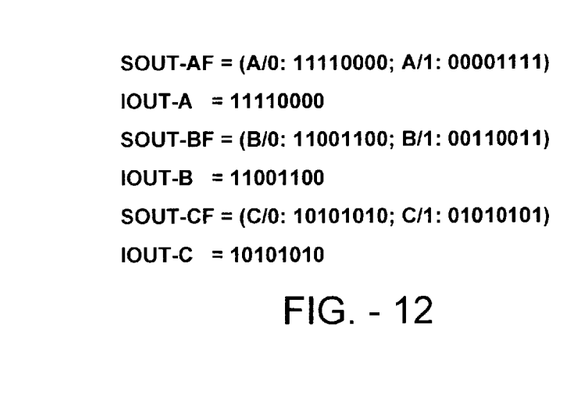
FIG. 12 is a list of equations illustrating fault-propagation and path-enabling rules as applied to portions of the logic circuit illustrated in FIG. 3.

Replace the empty set for each primary input fault-propagation function by the input's two stuck-at faults. Combine these with the appropriate 8-bit vector data structures, as illustrated by the equations of FIG. 12.

No fault nor output line is specified. Instead, all detectable faults will be found during a single pass through the circuit 300. Since there is a single output line only, the tests will be found, if at all, at the output line E 314.

Figure 13:
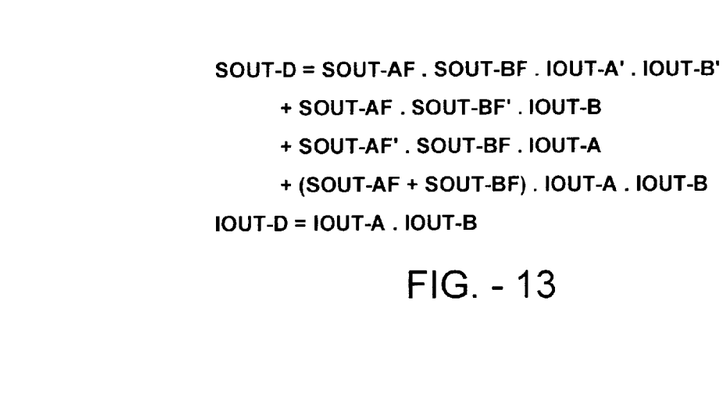
FIG. 13 is a list of equations illustrating fault-propagation and path-enabling rules as applied to another portion of the logic circuit of FIG. 3.
Figure 14:
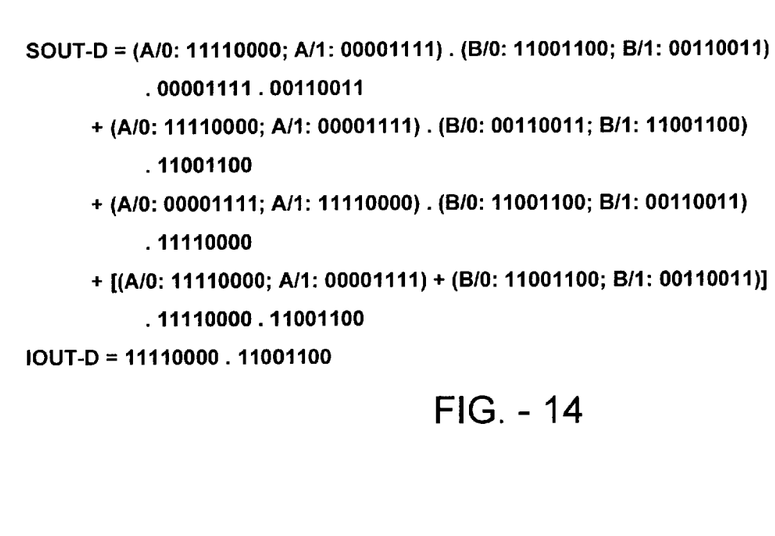
FIG. 14 illustrates the equations of FIG. 13 after substitutions of actual functions.

The AND gate 302 is processed next. To do so, get a copy of the rules for the 2-input AND gate from the library, as illustrated by first and second equations 1001 of FIG. 10. For purposes of this example, rewrite the copy of the rules as illustrated by the equations of FIG. 13. Substitute the functions derived for the primary inputs. A term is inverted by inverting the vector portion. The result of making the substitutions is shown by the equations of FIG. 14.

Figure 6:
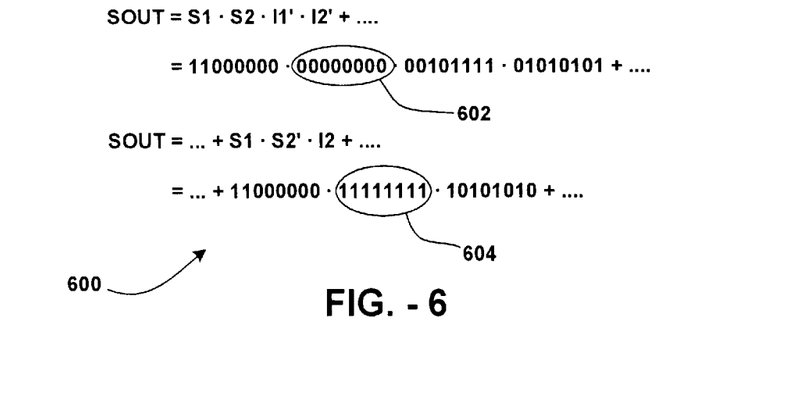
FIG. 6 illustrates portions of a typical fault-propagation rule according to the present invention.

FIG. 6 illustrates portions of a typical fault-propagation rule according to the present invention. The rule is designated generally by the reference numeral 600, and in particular includes an encircled all-zeros vector 602, and an encircled all-ones vector 604. The all-zeros vector 602 has been substituted in place of the fault-propagation function S2 because S2 does not include the specific fault being evaluated. For example, assume we are evaluating the fault B/0 and assume that S2 contains the faults A/1 and C/0 only. Based on that information, we conclude that the term S2 does not contain B/0. Therefore there is no combination of primary inputs A,B,C that produces the fault B/0 within S2. The proper way to indicate this result is to use an all-zeros vector whose significance is that there are no primary input combinations that produce B/0 within S2.

In like manner, when a vector substitution is to be made for the inverted S2, i.e., S2', and when S2 does not include the fault we are evaluating, then the all-zeros vector is inverted and we substitute the all-ones vector in place of the term S2', as illustrated in FIG. 6 by the encircled all-ones vector 604.

Figure 15:
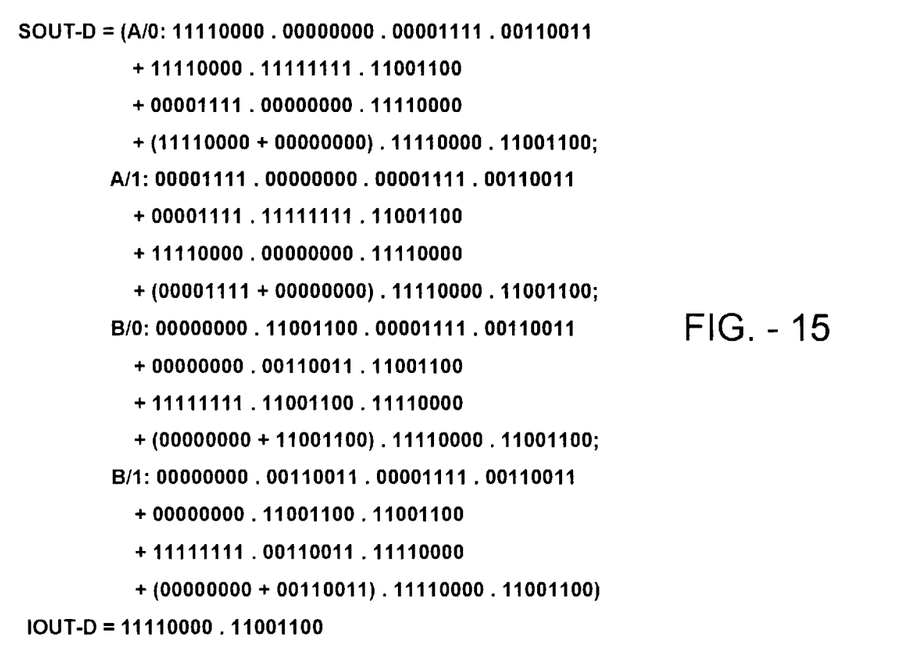
FIG. 15 illustrates the equations of FIG. 14 after Boolean combining of functions.
Figure 16:
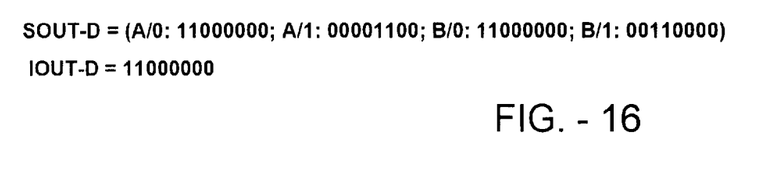
FIG. 16 illustrates the equations of FIG. 15 after simplification.
Figure 17:
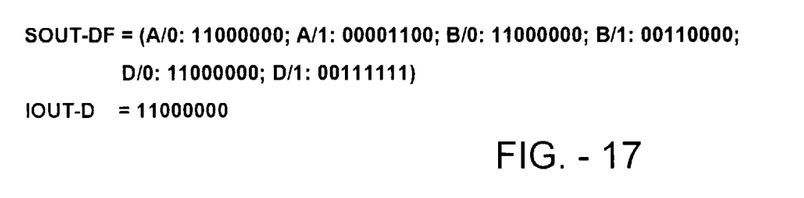
FIG. 17 illustrates the equations of FIG. 16 after a local fault is combined.

Continue the example above by carrying out the indicated intersections and unions. Separate functions are computed for each fault. When a fault is not present in a "fault-propagation" term, replace the term with an all-zeros vector, or if inverted, with an all-ones vector, as demonstrated by the equations shown in FIG. 15. Continue by further simplifying the expressions as illustrated by the equations shown in FIG. 16. Next, combine SOUT-D with D/0 and D/1, as illustrated by the equations of FIG. 17.

Figure 18:
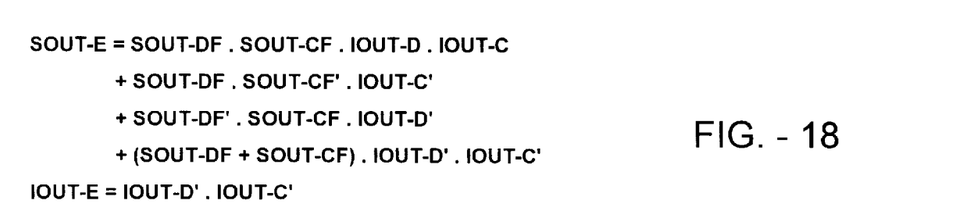
FIG. 18 illustrates equations defining fault-propagation and path-enabling functions for an output line of the logic circuit of FIG. 3.
Figure 19:
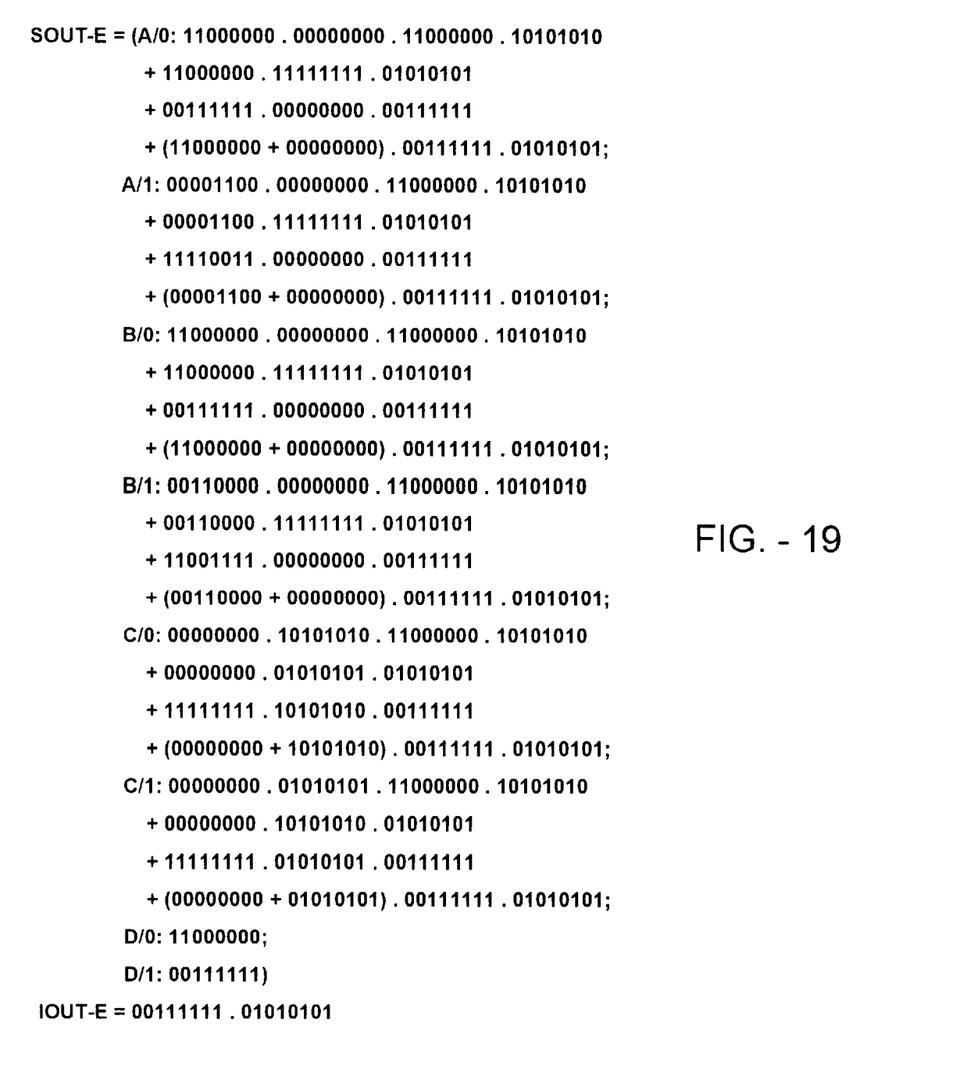
FIG. 19 illustrates the equations of FIG. 18 after substitution of actual Boolean functions.
Figure 20:
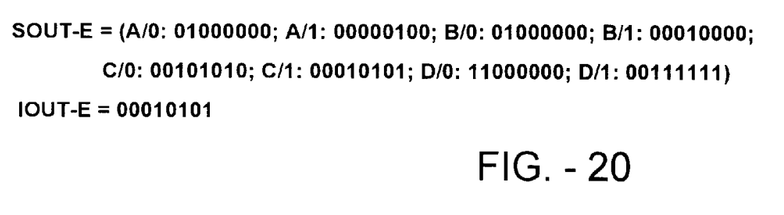
FIG. 20 illustrates the equations of FIG. 19 after simplification.
Figure 21:
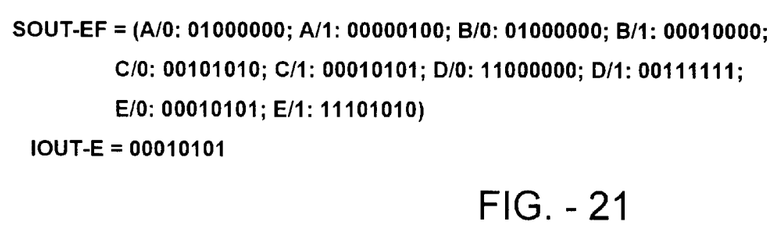
FIG. 21 illustrates the equations of FIG. 20 after a local fault is combined.

Continue by obtaining a copy of the rules for a 2-input NOR gate from the library. These rules are illustrated by the first and second equations 1004 of FIG. 10. Rewrite these rules for purposes of this example as illustrated by the equations of FIG. 18. Substitute the vectors, creating separate functions for each fault, using an all-zeros or all-ones vector as appropriate, as illustrated by the equations of FIG. 19. Continue by simplifying the expressions, as illustrated by the equations of FIG. 20. Next, combine SOUT-E with E/0 and E/1 to obtain the result shown by the equations of FIG. 21.

The following faults are detectable at the output line E 314: A/0, A/1, B/0, B/1, C/0, C/1, D/0, D/1, E/0, and E/1.

This information is revealed by the fact that the combined fault-propagation function SOUT-EF includes at least one test for each of these faults. The specific primary input combinations that test for each fault are determined by converting the 8-bit vectors into their corresponding forms.

Doing so provides the following tests: A/0: ABC=110; A/1: 010; B/0: 110; B/1: 100; C/0: 101, 011, 001; C/1: 100, 010, 000; D/0: 111, 110; D/1: 101, 100, 011, 010, 001, 000; E/0: 100, 010, 000; E/1: 111, 110, 101, 011, 001. Any one of the input combinations listed for a given fault is a "test" for that fault. Take for example the fault A/0: ABC=110. If a copy of the circuit 300 is fault-free and if the three primary inputs ABC are made 110, then the primary output E will a 1. If, on the other hand, the copy of the circuit 300 contains a single fault causing the primary input A to be stuck-at-0, and if the primary inputs are made ABC=110, then the primary output E will be a 0. Since the primary output E is a 1 for a fault-free copy of the circuit, and is a 0 for a faulty copy of the circuit, the input combination 110 is a test for the fault A stuck-at-0. A similar analysis will illustrate that each input combination shown above is in fact a valid "test" for the fault it is listed following the fault name.

The list above presents all of the tests for all detectable faults in the circuit 300. The tests were found during a single pass through the circuit according to a specific embodiment of the present invention.

Figure 7:
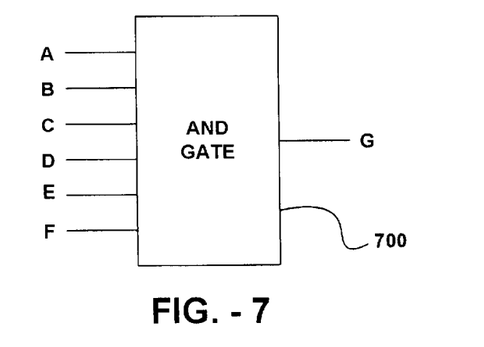
FIG. 7 is a block diagram that illustrates a 6-input AND gate.
Figure 8:
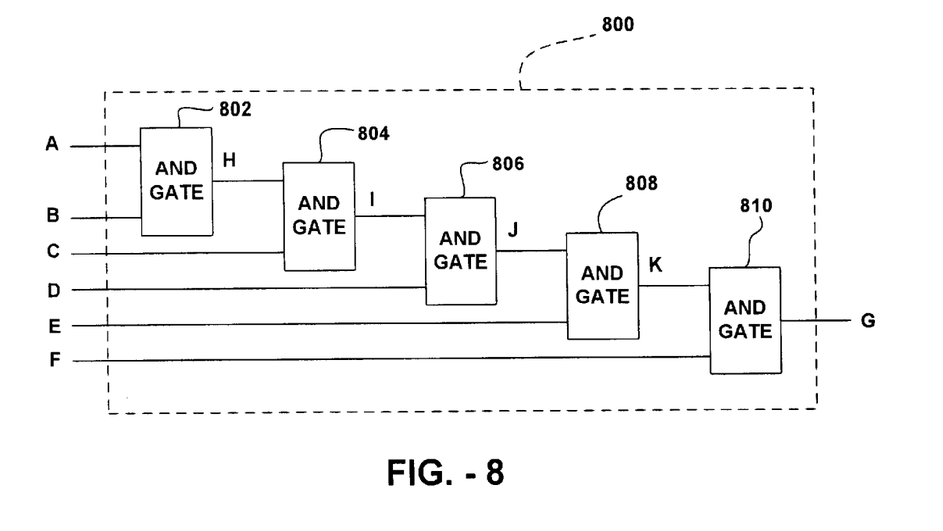
FIG. 8 is a block diagram that illustrates interconnected 2-input AND gates.

FIGS. 7, 8: Handling Wide Gates

FIG. 7 is a block diagram that illustrates a 6-input AND gate 700. The Boolean function library does not contain rules for a 6-input AND gate. FIG. 8 is a block diagram that illustrates interconnected 2-input AND gates, designated generally by the reference numeral 800, and includes 2-input AND gates 802–810.

The gate structure 800 is logically equivalent to the gate 700. A fault-propagation rule for the 2-input device has four terms (see the library), while a fault-propagation for a 3-input device has 8 terms. The number of terms doubles for each additional input. Thus, a fault-propagation rule for a 6-input device has 128 terms. In general, fault-propagation rules for combinational devices having more than four inputs are impractical to construct and apply.

The 6-input AND gate 700 can be represented for purposes of stuck-at fault testing by the equivalent structure 800. Application of the 2-input AND gate rules to the gates 802–810 will yield a valid set of tests for the 6-input gate 700.

FIGS. 9–21

These figures illustrate equations referred to within the description relating to FIGS. 1–8, above.

While the invention has been described in relation to the embodiments shown in the accompanying Drawing figures, other embodiments, alternatives and modifications will be apparent to those skilled in the art. It is intended that the Specification be exemplary only, and that the true scope and spirit of the invention be indicated by the following Claims.

What is claimed is:

1. A single-pass method for generating all test patterns for all detectable single stuck-at faults in a combinational circuit, comprising:

a step for defining data structures for a single stuck-at fault, a fault-propagation function, and a path-enabling function;

a step for defining function combining rules;

a step for applying the rules to the data structures, thereby creating new data structures;

the rules being applied in a circuit-level-by-circuit-level ascending order starting from the primary input level;

a step for attempting to activate and propagate all single stuck-at faults during a single pass through the circuit;

a step for determining from the attempt which primary input assignments succeed in activating and propagating a fault to a primary output;

a fault reaching a primary output defining a detectable fault;

primary input assignments permitting a fault to reach a primary output defining all test patterns for the fault, such that all tests for all detectable single stuck-at faults are generated during the single pass.

2. The method of claim 1, further including a step for providing a circuit definition, wherein the single pass is through the circuit definition.

3. The method of claim 2, wherein the circuit definition includes a netlist of interconnected primary inputs, logic elements, and primary outputs.

4. The method of claim 3, further including a step for sorting the circuit definition into a circuit-level order.

5. The method of claim 4, wherein the step for sorting proceeds in an ascending order from the level of the primary inputs.

6. The method of claim 1, wherein the fault data structure includes a fault name and a fault-propagation function.

7. The method of claim 1, wherein the path-enabling function defines a 1-set.

8. The method of claim 1, further including a step for providing data structures for primary inputs.

9. The method of claim 1, further including a step for deriving new function combining rules from existing function combining rules.

10. The method of claim 1, further including a step for providing means for storing data structures, and a step for storing data structures.

11. The method of claim 10, further including a step for determining the highest-order circuit level at which a data structure is used.

12. The method of claim 11, further including a step for releasing storage for a data structure once processing has progressed beyond the data structure's highest-order circuit level of use.

13. The method of claim 1, further including a step for determining that a fault has reached a primary output, and a step for ceasing the attempt to propagate the fault thereafter.

14. The method of claim 1, further including defining a set of all the single stuck-at faults for the combinational circuit, and wherein the attempting to activate step is applied to a subset only of the set of all the single stuck-at faults, such that all tests for all detectable single stuck-at faults of the subset are generated during a single pass.

15. A single-pass method for automatic test pattern generation in a combinational circuit, the method comprising:

a step for providing a description of a combinational circuit;

a step for sorting the description into a circuit-level order;

a step for providing initial Boolean functions corresponding to circuit primary inputs;

a step for providing rules for combining Boolean functions;

a step for applying the rules to the sorted circuit description, in an ascending circuit-level order, beginning from the circuit level of the primary inputs, and proceeding circuit-level-by-circuit-level through the sorted circuit description; and a step for deriving the test patterns from the results of the applying step for each primary output signal, eliminating conditional behavior, and generating all test patterns for all detectable single stuck-at faults in a single pass through the circuit description.

16. The level-by-level automatic test pattern generation method set forth in claim 15, further including:

a step for storing the results of the applying step;

a step for determining the highest circuit level at which a signal is used as an input to a circuit logic element; and a step for releasing storage for the Boolean function corresponding to the signal after Boolean function processing is complete at that highest circuit level use, wherein storage used for Boolean functions is freed when no longer needed, permitting larger circuits to be handled.

17. A computer program product for use with a computer system, comprising:

a computer readable medium;

means provided on the medium for directing the computer system to perform the following steps, defining a method for generating test patterns for combinational circuits during a single pass through the circuit:

providing a netlist defining the circuit in terms of circuit signals;

sorting the netlist into a circuit level order;

providing initial Boolean functions corresponding to circuit primary input signals;

providing rules for manipulating Boolean functions and corresponding to netlist defined logic elements;

determining the highest circuit level at which a signal is used as an input to a circuit logic element;

processing Boolean functions corresponding to the circuit signals, in an ascending circuit level order, from the circuit level of the primary input signals through the circuit level of the highest-level primary output signal;

storing the results of the processing;

releasing storage for the Boolean function corresponding to the signal after Boolean function processing is complete at that highest circuit level use; and deriving the test patterns from the stored results for the primary output signal(s), such that all tests for all detectable single stuck-at faults are generated in a single pass through the netlist.

18. The method of claim 17, further including defining a set of all the single stuck-at faults for the combinational circuit, and wherein the processing Boolean functions step is applied to a subset only of the set of all the single stuck-at faults, such that all tests for all detectable single stuck-at faults of the subset are generated during a single pass.

* * * * *